(12) United States Patent
Kitamura et al.

(10) Patent No.: US 6,628,351 B1
(45) Date of Patent: Sep. 30, 2003

(54) LIQUID CRYSTAL DISPLAY APPARATUS (75) Inventors: Toshiyasu Kitamura, Kanagawa (JP);
Hiroyuki Chihara, Tokyo (JP);
Shinichi Terao, Shizuoka (JP);
Takefumi Ishida, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 184 days.

(21) Appl. No.: 09/693,111

(22) Filed: Oct. 20, 2000

(30) Foreign Application Priority Data

Oct. 26, 1999 (JP) .......................... 11-304595

(51) Int. Cl.[7] .......................... G02F 1/1333
(52) U.S. Cl. .................. 349/56; 361/681; 439/165
(58) Field of Search .................. 349/56, 149, 150; 345/204; 313/511; 361/681, 683, 752; 439/44, 65, 74, 91, 165

(56) References Cited

U.S. PATENT DOCUMENTS

| 4,862,153 A | | 8/1989 | Nakatani | |
|---|---|---|---|---|
| 5,075,824 A | * | 12/1991 | Tan | 362/31 |
| 5,400,160 A | * | 3/1995 | Takahashi et al. | 349/60 |
| 5,652,606 A | * | 7/1997 | Sasaki et al. | 345/204 |
| 6,342,932 B1 | * | 1/2002 | Terao et al. | 349/58 |

FOREIGN PATENT DOCUMENTS

JP 01080858 10/1990

\* cited by examiner

*Primary Examiner*—Robert H. Kim
*Assistant Examiner*—P. R. Akkapeddi
(74) *Attorney, Agent, or Firm*—Pearne & Gordon LLP (57) ABSTRACT

In liquid crystal display apparatus comprising a liquid crystal display device and a flexible board with a pattern formed on one surface, the flexible board is bent approximately at the center in two via a bending section and the inner surfaces are hermetically fixed thus configuring a first pattern surface, associated parts, and a second pattern surface, contacts with the printed circuit board, at the rear of the first pattern surface. Via this configuration, the liquid crystal display apparatus can be configured using a flexible board having a single-sided pattern and assembly of the liquid crystal display device and the printed circuit board can be facilitated.

7 Claims, 3 Drawing Sheets

LIQUID CRYSTAL DISPLAY APPARATUS

BACKGROUND OF THE INVENTION

The present invention relates to liquid crystal display apparatus, and in particular to liquid crystal display apparatus wherein a flexible printed circuit board with a pattern formed on one surface is bent approximately at the center in two thus configuring a first pattern surface and a second pattern surface at the rear of the first pattern surface.

Portable terminal apparatus such as a portable telephone set and a PHS (Personal Handyphone System) terminal is getting more compact and lightweight year by year. Recently, a low-profile design and a large liquid crystal display have been key points for marketability of a product.

A plastic casing of liquid crystal display apparatus instead of a conventional glass casing has been contributed to a lightweight and low-profile design.

The plastic liquid crystal display apparatus, however, cannot accept the thermal crimping method at joints; thus the liquid crystal display apparatus cannot use flexible printed circuit boards (flexible boards) via the TAB (Tape Attach Bonding) method employed for a conventional glass liquid crystal display apparatus.

As the number of displayed characters increases, the number of joints with the main printed circuit board increases. This allows jointing via the thermal crimping method by using a COF (Chip On Film) flexible printed circuit board and reduces the number of joint poles with the main printed circuit board.

Figure 4:
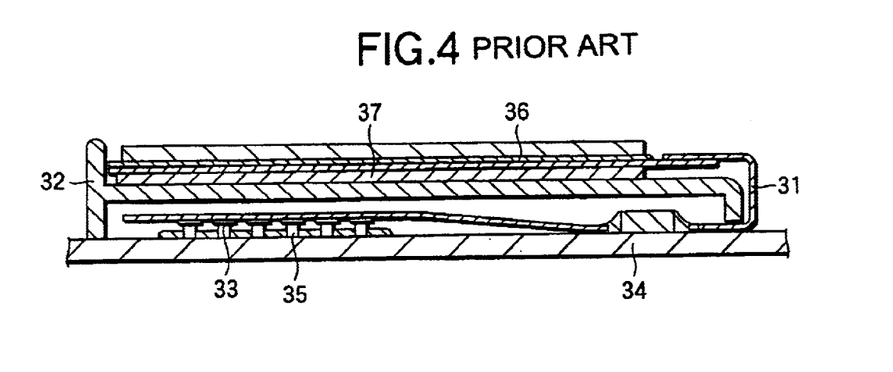
FIG. 4 is a side sectional view of conventional liquid crystal display apparatus assembled to configure a unit.

FIG. 4 is a side sectional view of conventional liquid crystal display apparatus assembled to configure a unit.

Referring to FIG. 4, liquid crystal display apparatus having a flexible board (for example a COF flexible board) 31 is assembled so as to be wrapped by a holding member 32 to form a unit. In the unit, contacts 33 provided on the flexible board 31 come in contact with connectors 35 provided on a printed circuit board 34.

Figure 5:
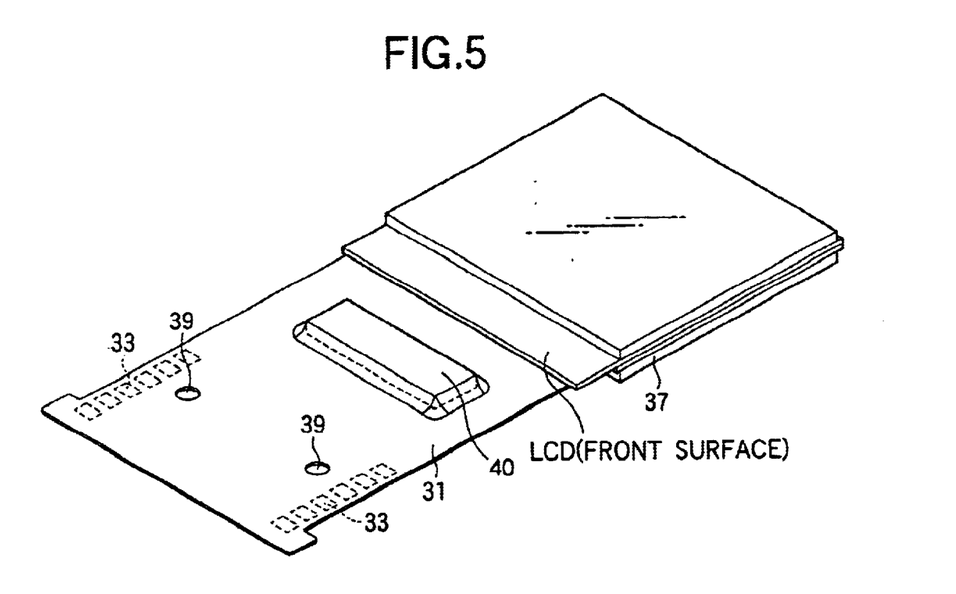
FIG. 5 is a perspective plan view of conventional liquid crystal display apparatus.

FIG. 5 is a perspective plan view of conventional liquid crystal display apparatus. The liquid crystal display (LCD) portion is arranged below the apparatus shown in FIG. 5. Referring to FIG. 5, the liquid crystal display apparatus is composed of a liquid crystal display device (LCD) 37 and a flexible board 31 such as a COF flexible board. The flexible board 31 such as a COF flexible board is provided with positioning holes 39 and mounts contacts 33 to make contact with connectors on the printed circuit board and associated parts 40 related to liquid crystal display operation.

Figure 6:
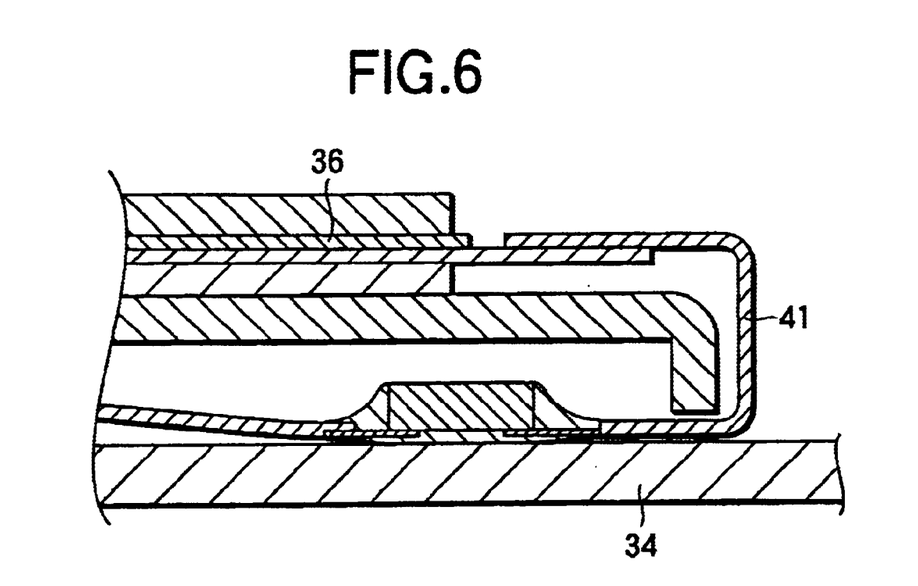
FIG. 6 is a side sectional view of another conventional liquid crystal display apparatus assembled to configure a unit.

FIG. 6 is a side sectional view of another conventional liquid crystal display apparatus assembled to configure a unit.

Referring to FIG. 6, liquid crystal display apparatus having a TAB 41 is assembled so as to be wrapped by a holding member to form a unit. In the unit, associated parts provided on the TAB 41 are attached to the TAB 41 via bonding.

Figure 7:
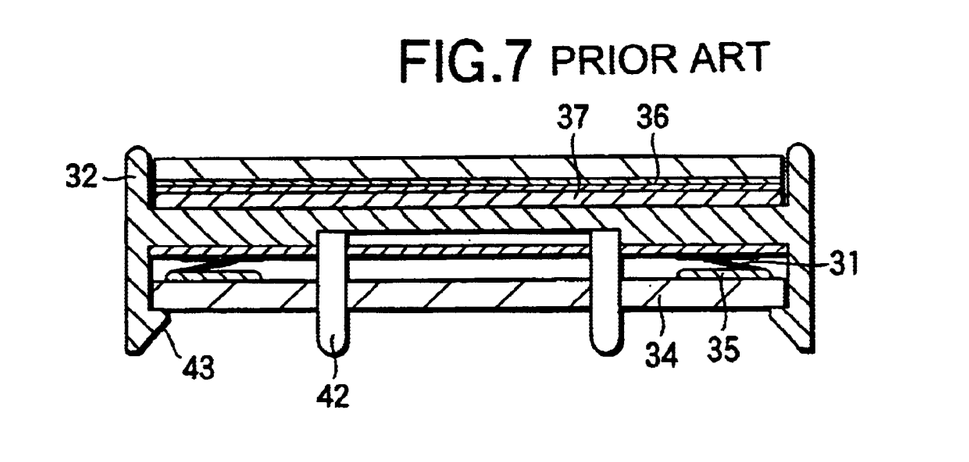
FIG. 7 is a front sectional view of conventional liquid crystal display apparatus assembled to configure a unit.

Referring to FIG. 7, bosses 42 provided on the holding member 32 are adapted to be in the positioning holes in the flexible board 31 such as a COF board as well as to pass through the positioning holes in the printed circuit board 34, and fixed to the printed circuit board 34 via a hook 43 provided on the holding member 32.

As shown in FIG. 5, in case the contact method is used for jointing with the main printed circuit board, there is a problem that the chip-mounted surface of the flexible printed circuit board mates oppositely with the contacts on the main printed circuit board, from the viewpoint of the design of the main unit.

The COF flexible printed circuit board uses a single-sided pattern. Thus there is a problem that the chip-mounted surface of the flexible printed circuit board mates oppositely with the contacts on the main printed circuit board.

SUMMARY OF THE INVENTION

The invention solves the aforementioned conventional problem and aims at providing liquid crystal display apparatus that can be configured using a flexible printed circuit board (flexible board) having a single-sided pattern and adapted to facilitate provide assembly of the apparatus.

The first aspect of the invention is liquid crystal display apparatus comprising a liquid crystal display device and a flexible board with a pattern formed on one surface, wherein the flexible board is bent approximately at the center in two and that the inner surfaces are hermetically fixed thus configuring a first pattern surface and a second pattern surface at the rear of the first pattern surface.

Via this configuration, the liquid crystal display apparatus can be configured using a flexible board having a single-sided pattern and assembly of the apparatus can be facilitated.

The second aspect of the invention is liquid crystal display apparatus having a flexible board connected to a liquid crystal display panel, wherein electronic parts are mounted adjacently to the liquid crystal display panel and contacts are provided adjacently to the electronic parts on one surface of the flexible board and that the flexible board is bent in S-shape and the liquid crystal display panel, electronic parts and contacts are stacked from top to bottom, in order to attach the flexible board to a printed circuit board, with the liquid crystal display surface exposed on the top, electrical parts sandwiched and contacts exposed on the bottom, thereby electrically connecting the contacts on the flexible board to the contacts provided on the printed circuit board.

Via this configuration, a liquid crystal display panel to which a flexible board with electrical parts and contacts provided on one surface can be attached to a printed circuit board.

The third aspect of the invention is liquid crystal display apparatus comprising a liquid crystal display panel, a flexible board to be connected to the liquid crystal display panel, and holding means for holding the liquid crystal display panel and the flexible board, wherein electronic parts are mounted adjacently to the liquid crystal display panel and contacts are provided adjacently to the electronic parts on one surface of the flexible board in advance, wherein the flexible board is connected to the liquid crystal display panel, and wherein the flexible board is bent in S-shape and attached to the holding means, with the liquid crystal display panel, electronic parts and contacts stacked from top to bottom, thereby configuring a liquid crystal display panel unit.

Via this configuration, it is possible to assemble a liquid crystal display panel unit, with the liquid crystal display surface exposed on the top, electrical parts sandwiched and contacts exposed on the bottom.

The fourth aspect of the invention is liquid crystal display apparatus having a flexible board which is electrically connected to a liquid crystal display device and attached to a holding member, and contacts provided on the flexible board and connectors provided on a printed circuit board being electrically connected, wherein the flexible board is provided with a bending section whereby the flexible board can be bent approximately at the center in two, wherein the flexible board is provided with the positioning holes symmetrical with respect to a line about the bending section, wherein contacts electrically connected to the printed circuit board are provided near the positioning hole at the frond end of the flexible board, that associated parts for driving the liquid crystal display device are mounted near the positioning hole at the end behind the bending section of the flexible board, and wherein the associated parts are positioned on and attached to the holding member after the bending section is bent, thereby allowing electrical connection with the printed circuit board.

Via this configuration, the liquid crystal display apparatus can be configured using a flexible board having a single-sided pattern and assembly of the apparatus can be facilitated.

The fifth aspect of the invention is liquid crystal display apparatus according to the fourth aspect of the invention, further comprising a reinforcing plate is bonded to the rear side of the flexible board comprising the positioning hole at the front end of the flexible board and the contacts electrically connected to the printed circuit board.

Via this configuration, the contacts provided on the flexible board can come in contact with connectors mounted on the printed circuit board.

The sixth aspect of the invention is liquid crystal display apparatus according to the fourth aspect of the invention, wherein the bending section provided on the flexible board is equipped with notches in approximate half rectangles on both sides of the flexible board and a notch in an approximate rectangle in the center, respectively.

Via this configuration, the bending section can be bent with ease.

The seventh aspect of the invention is liquid crystal display apparatus according to the fourth aspect of the invention, wherein the contacts electrically connected to the printed circuit board are provided outside the positioning hole at the front end of the flexible board and that associated parts for driving the liquid crystal display device are provided inside the positioning hole at the end behind the bending section of the flexible board.

Via this configuration, noises coming from signal sources do not overlap with each other even when the flexible board is bent.

The eighth aspect of the invention is liquid crystal display apparatus according to the seventh aspect of the invention, wherein the associated parts for driving the liquid crystal display device provided inside the positioning hole at the end behind the bending section of the flexible board are mounted so as to keep their weight balanced about the center of the flexible board.

Via this configuration, it is possible to arrange parts mounted on a flexible board in a balanced way thereby smoothing out the load on the flexible board.

DETAILED DESCRIPTION OF THE PREFERRED EMBODIMENT

The embodiment of the invention will be explained with reference to FIGS. 1 through 3.

Figure 1:
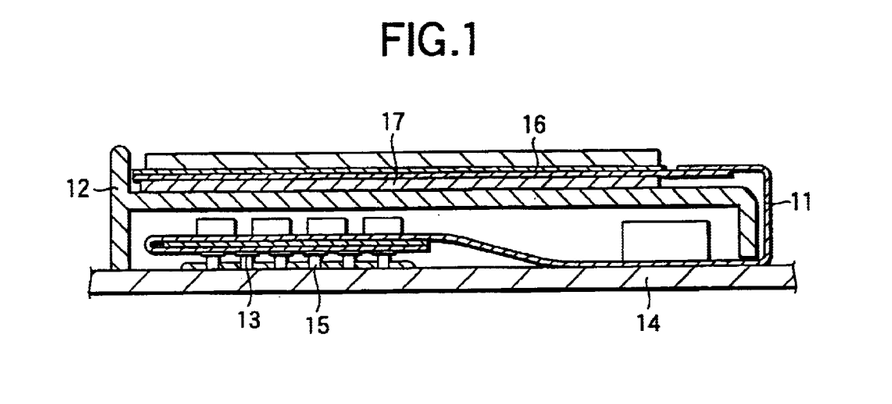
FIG. 1 is a side sectional view of liquid crystal display apparatus according to the embodiment of the invention assembled to configure a unit.

FIG. 1 is a side sectional view of liquid crystal display apparatus according to the embodiment of the invention assembled to configure a unit.

Referring to FIG. 1, liquid crystal display apparatus having a flexible board (for example a COF flexible board) 11 whose end is bent at the bending section is assembled so as to be wrapped by a holding member 12 to form a unit. In the unit, contacts 13 provided on the flexible board 11 come in contact with connectors 15 provided on a printed circuit board 14.

Figure 2:
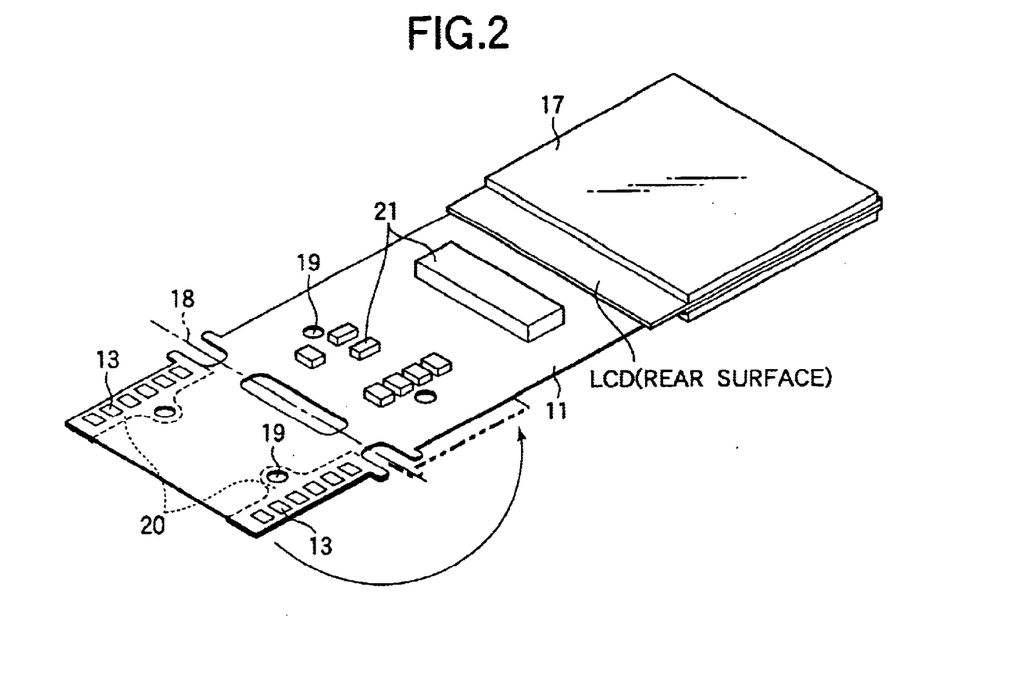
FIG. 2 is a perspective plan view of liquid crystal display apparatus according to the embodiment of the invention.

FIG. 2 is a perspective plan view of liquid crystal display apparatus according to the embodiment of the invention. Referring to FIG. 2, the liquid crystal display apparatus is composed of a liquid crystal display device (LCD) 17 and a flexible board 11 such as a COF flexible board. The flexible board 11 such as a COF flexible board is provided with a bending section 18 and positioning holes 19. At the front and back of the bending section 18 are mounted or soldered contacts 13 that come in contact with connectors on a printed circuit board and associated parts 21 such as chips related to liquid crystal display operation.

Contacts 13 electrically connected to a printed circuit board are provided outside the positioning hole 19 at the front end of the flexible board 11 and associated parts 21 such as chips for driving the liquid crystal display device are provided inside the positioning hole at the end behind the bending section 18. Via this configuration, noises coming from signal sources do not overlap with each other even when the flexible board is bent.

The associated parts 21 such as chips for driving the liquid crystal display device provided inside the positioning hole at the end behind the bending section of the flexible board are mounted so as to keep their weight balanced about the center of the flexible board 11. Via this configuration, it is possible to arrange parts mounted on a flexible board in a balanced way thereby smoothing out the load on the flexible board.

The bending section 18 is equipped with notches in approximate half rectangles on both sides of the flexible board 11 such as a COF flexible board and a notch in an approximate rectangle in the center, respectively. A reinforcing plate 20 is bonded to the contacts 13 so as to cover the positioning holes. In the positioning holes 19 provided symmetrically with respect to a line at the front and back of the bending section 18, bosses 22 of the holding member (FIG. 3) can be inserted while the flexible board 11 is bent at the bending section 18. By doing so, the contacts 13 are positioned where they come in contact with connectors 15 provided on the printed circuit board.

Figure 3:
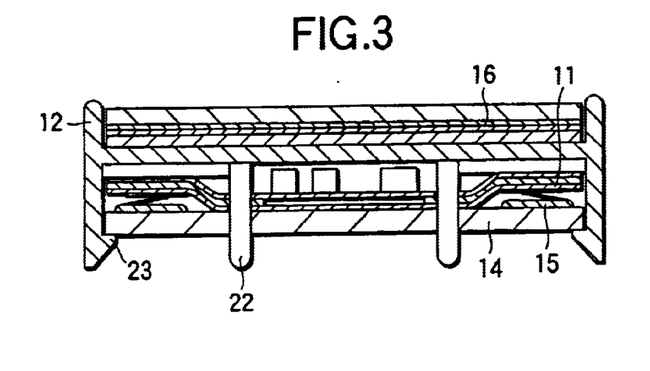
FIG. 3 is a front sectional view of liquid crystal display apparatus according to the embodiment of the invention assembled to configure a unit.

FIG. 3 is a front sectional view of liquid crystal display apparatus according to the embodiment of the invention assembled to configure a unit.

Referring to FIG. 3, bosses 22 provided on the holding member 12 are adapted to be inserted in the positioning holes 19 in the flexible board 11 such as a COF board as well as to pass through the positioning holes in the printed circuit board 14, and fixed to the printed circuit board 14 via a hook 23 provided on the holding member 12.

As a result, contacts 13 provided on the flexible board 11 such as a COF can come in contact with connectors 15 provided on printed circuit board 14 at a favorable pressure.

The first aspect of the invention is liquid crystal display apparatus comprising a liquid crystal display device and a flexible board with a pattern formed on one surface, wherein the flexible board is bent approximately at the center in two and that the inner surfaces are hermetically fixed thus configuring a first pattern surface and a second pattern surface at the rear of the first pattern surface. Via this configuration, the liquid crystal display apparatus can be configured using a flexible board having a single-sided pattern and assembly of the apparatus can be facilitated.

The second aspect of the invention is liquid crystal display apparatus having a flexible board connected to a liquid crystal display panel, wherein electronic parts are mounted adjacently to the liquid crystal display panel and contacts are provided adjacently to the electronic parts on one surface of the flexible board and that the flexible board is bent in S-shape and the liquid crystal display panel, electronic parts and contacts are stacked from top to bottom, in order to attach the flexible board to a printed circuit board, with the liquid crystal display surface exposed on the top, electrical parts sandwiched and contacts exposed on the bottom, thereby electrically connecting the contacts on the flexible board to the contacts provided on the printed circuit board. Via this configuration, a liquid crystal display panel to which a flexible board with electrical parts and contacts provided on one surface can be attached to a printed circuit board.

The third aspect of the invention is liquid crystal display apparatus comprising a liquid crystal display panel, a flexible board to be connected to the liquid crystal display panel, and holding means for holding the liquid crystal display panel and the flexible board, wherein electronic parts are mounted adjacently to the liquid crystal display panel and contacts are provided adjacently to the electronic parts on one surface of the flexible board in advance, wherein the flexible board is connected to the liquid crystal display panel, and wherein the flexible board is bent in S-shape and attached to the holding means, with the liquid crystal display panel, electronic parts and contacts stacked from top to bottom, thereby configuring a liquid crystal display panel unit. Via this configuration, it is possible to assemble a liquid crystal display panel unit, with the liquid crystal display surface exposed on the top, electrical parts sandwiched and contacts exposed on the bottom.

The fourth aspect of the invention is liquid crystal display apparatus having a flexible board which is electrically connected to a liquid crystal display device and attached to a holding member, and contacts provided on the flexible board and connectors provided on a printed circuit board being electrically connected, wherein the flexible board is provided with a bending section whereby the flexible board can be bent approximately at the center in two, wherein the flexible board is provided with the positioning holes symmetrical with respect to a line about the bending section, wherein contacts electrically connected to the printed circuit board are provided near the positioning hole at the frond end of the flexible board, wherein associated parts for driving the liquid crystal display device are mounted near the positioning hole at the end behind the bending section of the flexible board, and wherein the associated parts are positioned on and attached to the holding member after the bending section is bent, thereby allowing electrical connection with the printed circuit board. Via this configuration, the liquid crystal display apparatus can be configured using a flexible board having a single-sided pattern and assembly of the apparatus can be facilitated.

The fifth aspect of the invention is liquid crystal display apparatus according to the fourth aspect of the invention, further comprising a reinforcing plate is bonded to the rear side of the flexible board comprising the positioning hole at the front end of the flexible board and the contacts electrically connected to the printed circuit board. Via this configuration, the contacts provided on the flexible board can come in contact with connectors mounted on the printed circuit board.

The sixth aspect of the invention is liquid crystal display apparatus according to the fourth aspect of the invention, wherein the bending section provided on the flexible board is equipped with notches in approximate half rectangles on both sides of the flexible board and a notch in an approximate rectangle in the center, respectively. Via this configuration, the bending section can be bent with ease.

The seventh aspect of the invention is liquid crystal display apparatus according to the fourth aspect of the invention, wherein the contacts electrically connected to the printed circuit board are provided outside the positioning hole at the front end of the flexible board and that associated parts for driving the liquid crystal display device are provided inside the positioning hole at the end behind the bending section of the flexible board. Via this configuration, noises coming from signal sources do not overlap with each other even when the flexible board is bent.

The eighth aspect of the invention is liquid crystal display apparatus according to the seventh aspect of the invention, wherein the associated parts for driving the liquid crystal display device provided inside the positioning hole at the end behind the bending section of the flexible board are mounted so as to keep their weight balanced about the center of the flexible board. Via this configuration, it is possible to arrange parts mounted on a flexible board in a balanced way thereby smoothing out the load on the flexible board.

What is claimed is:

1. Liquid crystal display apparatus comprising:
   a liquid crystal display panel;
   a flexible board connected to said liquid crystal display panel;
   an electronic part mounted adjacently to said liquid crystal display panel;
   a contact provided adjacently to said electronic part on one surface of said flexible board; and
   a printed circuit board having a contact,
   wherein said flexible board is bent in S-shape to stack said liquid crystal display panel, said electronic part and said contact on said flexible board from top to bottom, and said flexible board is attached to said printed circuit board, said electronic part sandwiched and said contact on said flexible board exposed on the bottom, thereby said contact on said flexible board is positioned to come in contact and is electrically connected to said contact provided on the printed circuit board.

2. Liquid crystal display apparatus according to claim 1, further comprising a holder which holds said liquid crystal display panel and said flexible board.

3. Liquid crystal display apparatus comprising:

a liquid crystal display device;

a flexible board electrically connected to a liquid crystal display device;

a holding member to which said flexible board is attached;

a bending section provided in said flexible board so that said flexible board is bent approximately at the center in two;

positioning holes provided in said flexible board symmetrical with respect to a line about said bending section;

contacts electrically provided in a vicinity of said positioning hole at the frond end of said flexible board and electrically connected to a printed circuit board; and an associated part for driving said liquid crystal display device mounted on a vicinity of said positioning hole at the end behind said bending section of said flexible board, and positioned on and attached to said holding member after said bending section is bent.

4. Liquid crystal display apparatus according to claim 3 further comprising a reinforcing plate bonded to the rear side of a part of said flexible board, the part includes said positioning hole at the front end of said flexible board and the contacts electrically connected to said printed circuit board.

5. Liquid crystal display apparatus according to claim 3, wherein said bending section is equipped with notches in approximate half rectangles on both sides of said flexible board and a notch in an approximate rectangle in the center, respectively.

6. Liquid crystal display apparatus according to claim 3, wherein said contact is provided outside said positioning hole at the front end of said flexible board, and said associated part are provided inside said positioning hole at the end behind said bending section of said flexible board.

7. Liquid crystal display apparatus according to claim 6, wherein said associated part is mounted so as to keep their weight balanced about the enter of said flexible board.

* * * * *

UNITED STATES PATENT AND TRADEMARK OFFICE
CERTIFICATE OF CORRECTION

PATENT NO. : 6,628,351 B1
DATED : September 30, 2003
INVENTOR(S) : Toshiyasu Kitamura et al.

It is certified that error appears in the above-identified patent and that said Letters Patent is hereby corrected as shown below:

Drawings,
Please replace Sheet 2 of 3, containing Figs. 3-5, and Sheet 3 of 3, containing Figs. 6-7, with the attached sheet 2/3, containing Figs. 3-5, and sheet 3/3, containing Figs. 6-7.

Column 1,
Before the paragraph beginning on line 57, which starts "Referring to FIG. 7, bosses 42 provided...", on a new line, please insert the following paragraph:
-- Fig. 7 is a front sectional view of conventional liquid crystal display apparatus shown in Fig. 4 assembled to configure a unit. --
Line 58, after "...adapted to be", please insert -- inserted --.

Column 7,
Line 13, please delete "frond", and insert therefor -- front --.

Column 8,
Line 19, please delete "enter", and insert therefor -- center --.

Signed and Sealed this

Twentieth Day of January, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,628,351 B1
DATED : September 30, 2003
INVENTOR(S) : Toshiyasu Kitamura et al.

It is certified that error appears in the above-identified patent and that said Letters Patent is hereby corrected as shown below:

Drawings,
Please replace Sheet 2 of 3, containing Figs. 3-5, and Sheet 3 of 3, containing Figs. 6-7, with the attached sheet 2/3, containing Figs. 3-5, and sheet 3/3, containing Figs. 6-7.

Column 1,
Before the paragraph beginning on line 57, which starts "Referring to FIG. 7, bosses 42 provided...", on a new line, please insert the following paragraph:
-- Fig. 7 is a front sectional view of conventional liquid crystal display apparatus shown in Fig. 4 assembled to configure a unit. --
Line 58, after "...adapted to be", please insert -- inserted --.

Column 7,
Line 13, please delete "frond", and insert therefor -- front --.

Column 8,
Line 19, please delete "enter", and insert therefor -- center --.

This certificate supersedes Certificate of Correction issued January 20, 2004.

Signed and Sealed this

Fourteenth Day of September, 2004

JON W. DUDAS
*Director of the United States Patent and Trademark Office*

UNITED STATES PATENT AND TRADEMARK OFFICE
CERTIFICATE OF CORRECTION

PATENT NO. : 6,628,351 B1
DATED : September 30, 2003
INVENTOR(S) : Toshiyasu Kitamura et al.

It is certified that error appears in the above-identified patent and that said Letters Patent is hereby corrected as shown below:

Drawings,
Please replace Sheet 2 of 3, containing Figs. 3-5, and Sheet 3 of 3, containing Figs. 6-7, with the attached sheet 2/3, containing Figs. 3-5, and sheet 3/3, containing Figs. 6-7.

Column 1,
Before the paragraph beginning on line 57, which starts "Referring to FIG. 7, bosses 42 provided…", on a new line, please insert the following paragraph:
-- Fig. 7 is a front sectional view of conventional liquid crystal display apparatus shown in Fig. 4 assembled to configure a unit. --
Line 58, after "…adapted to be", please insert -- inserted --.

Column 7,
Line 13, please delete "frond", and insert therefor -- front --.

Column 8,
Line 19, please delete "enter", and insert therefor -- center --.

This certificate supersedes Certificate of Correction issued January 20, 2004.

Signed and Sealed this

Twenty-eighth Day of September, 2004

JON W. DUDAS
*Director of the United States Patent and Trademark Office*